US007642467B1

(12) United States Patent
Tavkhelidze

(10) Patent No.: US 7,642,467 B1
(45) Date of Patent: Jan. 5, 2010

(54) METHOD FOR FABRICATION OF SEPARATORS FOR ELECTRODE PAIRS IN DIODES

(75) Inventor: Avto Tavkhelidze, Tbilisi (GE)

(73) Assignee: Borealis Technical Limited (GI)

( * ) Notice: Subject to any disclaimer, the term of this patent is extended or adjusted under 35 U.S.C. 154(b) by 929 days.

(21) Appl. No.: 11/293,411

(22) Filed: Dec. 2, 2005

Related U.S. Application Data

(62) Division of application No. 10/417,494, filed on Apr. 17, 2003, now Pat. No. 6,971,165.

(60) Provisional application No. 60/373,507, filed on Apr. 17, 2002.

(51) Int. Cl.
*H01R 12/04* (2006.01)
*H05K 1/11* (2006.01)

(52) U.S. Cl. ........................ 174/261; 361/767; 361/773

(58) Field of Classification Search ................. 174/261; 361/773–774, 767–771
See application file for complete search history.

(56) References Cited

U.S. PATENT DOCUMENTS

| | | | |
|---|---|---|---|
| 3,740,592 A | 6/1973 | Engdahl et al. | |
| 3,816,173 A | 6/1974 | Eldridge et al. | |
| 3,999,203 A | 12/1976 | Lahiri | |
| 4,011,582 A | 3/1977 | Cline et al. | |
| 4,063,965 A | 12/1977 | Cline et al. | |
| 4,145,699 A | 3/1979 | Hu et al. | |
| 5,307,561 A * | 5/1994 | Feigenbaum et al. | 29/846 |
| 5,336,547 A | 8/1994 | Kawakita et al. | |
| 5,744,759 A * | 4/1998 | Ameen et al. | 174/260 |
| 5,917,156 A | 6/1999 | Nobori et al. | |
| 6,214,651 B1 | 4/2001 | Cox | |
| 6,225,205 B1 | 5/2001 | Kinoshita | |
| 6,246,587 B1 * | 6/2001 | Chen | 361/773 |
| 6,417,060 B2 | 7/2002 | Tavkhelidze et al. | |
| 2001/0046749 A1 | 11/2001 | Tavkhelidze et al. | |
| 2002/0170172 A1 | 11/2002 | Tavkhelidze et al. | |
| 2006/0118330 A1 * | 6/2006 | Ooyabu et al. | 174/261 |

FOREIGN PATENT DOCUMENTS

WO WO 99/13562 A1 3/1999

* cited by examiner

*Primary Examiner*—Jeremy C Norris

(57) ABSTRACT

An improved method for manufacturing a matching pair of electrodes comprises the steps of: fabricating a first electrode with a substantially flat surface; depositing islands of an oxidizable material over regions of the surface; depositing a layer of a third material over the surface of the first electrode to form a second electrode; separating the first electrode from the second electrode; oxidizing the islands of oxidizable material, which causes the islands to expand; bringing the upper electrode and the lower electrode into close proximity, whereupon the expanded island of oxidizable material touches the upper surface and creates an insulating gap between the two surfaces, thereby forming a matching pair of electrodes.

8 Claims, 1 Drawing Sheet

METHOD FOR FABRICATION OF SEPARATORS FOR ELECTRODE PAIRS IN DIODES

CROSS-REFERENCE TO RELATED APPLICATIONS

This application is a divisional application of U.S. patent application Ser. No. 10/417,494, filed 17 Apr. 2003 now U.S. Pat. No. 6,971,165, and which claims the benefit of U.S. Provisional Application No. 60/373,507, filed 17 Apr. 2002. This application is related to U.S. application Ser. No. 10/234,498, filed 3 Sep. 2002, which claims the benefit of U.S. Provisional Application No. 60/316,918, filed 2 Sep. 2001.

BACKGROUND OF THE INVENTION

The present invention is related to diode devices, in particular to methods for making diode devices and particularly for making separators for matched pairs of electrodes that may be used in a diode device. The term diode devices encompass, for example, thermionic converters and generators, photoelectric converters and generators, and vacuum diode heat pumps. It is also related to thermotunnel converters.

WO99/13562 discloses a method for making pairs of electrodes whose surfaces replicate each other. This approach uses solvents and reactive solutions, and involves heating and evaporating metal surfaces.

DEFINITIONS

"Power Chip" is hereby defined as a device that uses a thermal gradient of any kind to create an electrical power or energy output. Power Chips may accomplish this using thermionics, thermotunneling, or other methods as described in this application.

"Cool Chip" is hereby defined as a device that uses electrical power or energy to pump heat, thereby creating, maintaining, or degrading a thermal gradient. Cool Chips may accomplish this using thermionics, thermotunneling, or other methods as described in this application.

"Gap Diode" is defined as any diode which employs a gap between the anode and the cathode, or the collector and emitter, and which causes or allows electrons to be transported between the two electrodes, across or through the gap. The gap may or may not have a vacuum between the two electrodes, though Gap Diodes specifically exclude bulk liquids or bulk solids in between the anode and cathode. The Gap Diode may be used for Power Chips or Cool Chips, for devices that are capable of operating as both Power Chips and Cool Chips, or for other diode applications.

Surface features of two facing surfaces of electrodes "matching" each other, means that where one has an indentation, the other has a protrusion and vice versa. Thus, the two surfaces are substantially equidistant from each other throughout their operating range.

BRIEF SUMMARY OF THE INVENTION

Thus there is a need for a method for providing paired electrodes that is more rapid, more economical and more environmentally friendly than existing approaches. The present method allows the fabrication of matched pair of electrodes with controllable distance between the electrodes.

In accordance with one embodiment of the present invention, an improved method for manufacturing a pair of electrodes comprises the steps of: fabricating a first electrode with a substantially flat surface; depositing a islands of an oxidizable material over regions of the surface (islands); depositing a layer of a second material over the surface of the first electrode to form a second electrode; separating the first electrode from the second electrode in the way that islands remain attached to first electrode; oxidizing the islands of oxidizable material, which causes the layer first to become electrical insulator and second to expand (for example Al when oxidized becomes $Al_2O_3$ which is electrical insulator and increases its volume relative to Al); bringing the upper electrode and the lower electrode into close proximity so that the expanded island of oxidizable material touches the upper electrode and creates an insulating vacuum gap between the two surfaces.

The present invention further discloses a method for fabricating a pair of electrodes in which any minor variations in the surface of one electrode are replicated in the surface of the other. This permits the electrodes to be spaced in close proximity.

In accordance with a second embodiment of the present invention, a pair of electrodes is disclosed which comprises a substantially flat first electrode having one or more islands of a material covering pre-determined regions, in which the regions that are not covered by the islands constitute an active surface; and a second electrode having one or more recesses in its surface at similar loci to the islands on the first electrode. The recesses are slightly smaller than the islands, so that when the recesses contact the islands a distance in the range of 1 to 100 nm separates the active surfaces. Regions of the second electrode not having the recesses form an active surface in which any imperfections on the active surface of the first electrode are matched on the active surface of the second electrode.

The technical advantage of the present invention is that a method is provided for preparing matched pairs of closely spaced electrodes in which the separation is maintained by insulating spacers. Another technical advantage of the present invention is that the matched pairs of electrodes may be used in Gap Diodes or Power Chips or Cool Chips. A further technical advantage is that the method is easily achieved using conventional micro-manufacturing techniques, and does not require solvents and reactive solutions. A further technical advantage of the present invention is that the resulting Gap Diode will be extremely resistant to vibration and shock, as the oxide spacers counteract any such stresses. A further technical advantage of the present invention is that Power Chips or Cool Chips or Gap Diodes are provided in which the separation of the electrodes is reduced to nanometer distances, and is maintained at this small distance by the presence of insulator spacers. A further technical advantage of the present invention is to provide pairs of electrodes in which any minor imperfections in the surface of one electrode are replicated in the surface of the other electrode.

BRIEF DESCRIPTION OF THE SEVERAL VIEWS OF THE DRAWING

For a more complete understanding of the present invention and the technical advantages thereof, reference is made to the following description taken with the accompanying drawing, in which.

DETAILED DESCRIPTION OF THE INVENTION

Figure 1:
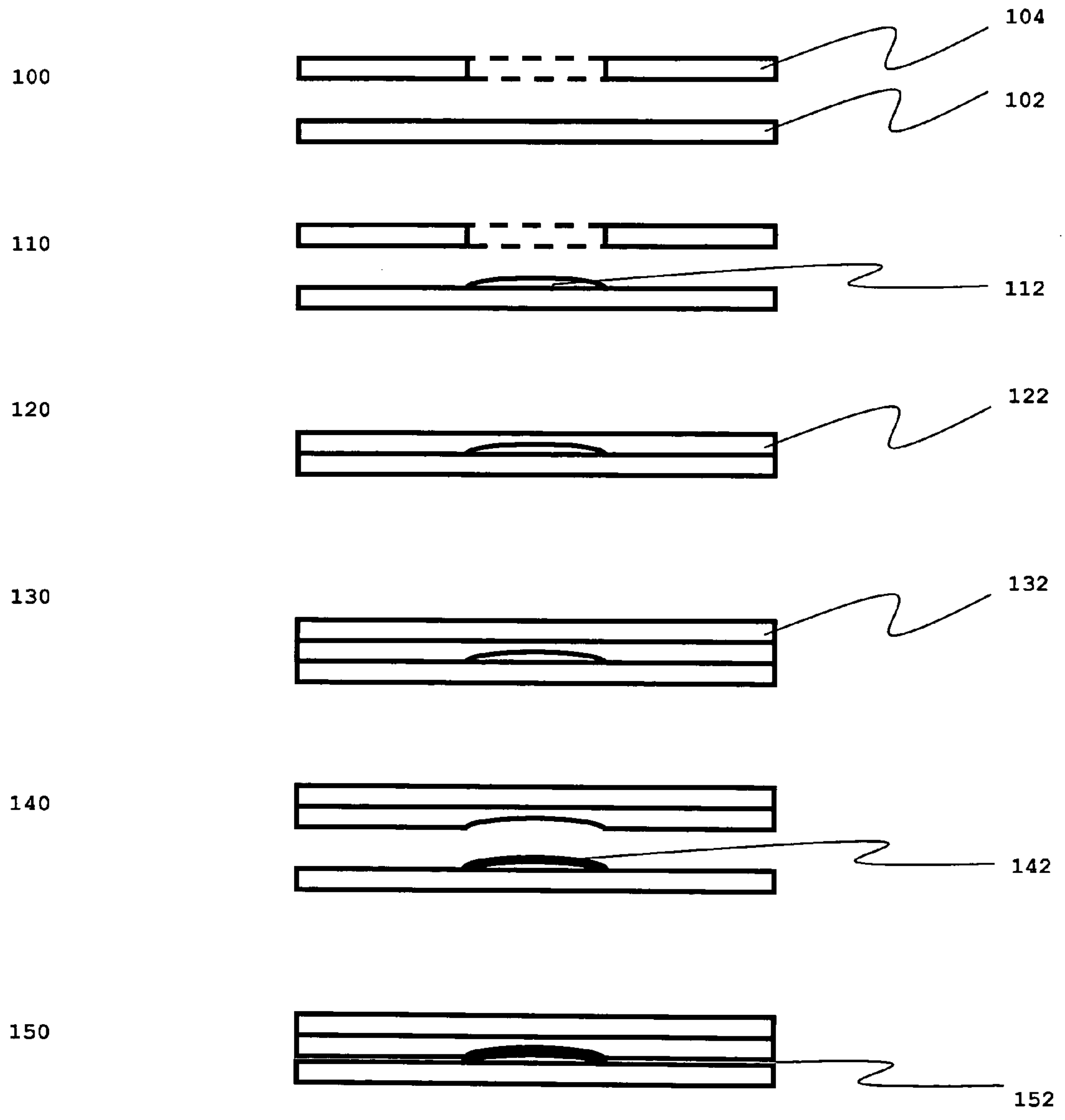
FIG. 1 is a schematic representation of a process for the manufacturing of pair of electrodes having matching surface details.

The embodiments of the present invention and its technical advantages are best understood by referring to FIG. 1.

Referring now to FIG. 1, which shows a schematic for the fabrication of a pair of closely spaced electrodes, in step 100 a wafer 102 of a first metal is placed underneath a metallic mask 104. Wafer 102 will form one electrode of the pair, and has a substantially flat surface. 102 is preferably titanium. Wafer 102 may itself be deposited on a substrate (not shown) comprising a material such as silicon. In step 110 island of an oxidizable material 112 is deposited through the mask onto the wafer to form a raised island using conventional vapor deposition techniques. Only one such raised region is shown for clarity, but a number of such raised islands may be deposited through the mask onto the surface of the wafer. In one embodiment, the raised island or islands comprise the oxidizable material. In a further embodiment, a small amount of oxygen is admitted into the vacuum deposition chamber during deposition, so that the oxidizable material is oxidized as it is deposited. Oxygen is removed entirely from the deposition chamber during the final stages of deposition so that the surface or islands comprise oxidized material with a surface layer of oxidizable material. In preferred embodiments, the oxidizable material is aluminum, chosen because its oxide $Al_2O_3$ is hard, a good insulator, and because the oxide occupies approximately 25% more volume than Al itself. Table 1 lists some oxidation expansion coefficients of other metal oxides; some of these may be used in combination.

TABLE 1

| Material | Oxidation expansion coefficient |
|---|---|
| $Al_2O_3$ | 1.28-1.54 depending on orientation |
| $Ti_2O_3$ | 1.46 |
| $Y_2O_3$ | 1.82 |
| ZnO | 1.55 |

In step 120 a layer of material 122 is deposited over wafer 102 and oxidizable islands 112 as shown. In a preferred embodiment, material 122 is silver. In step 130, a layer of material 132 is applied. In a preferred embodiment, material 132 is copper and is applied by an electrochemical process. In step 140, the assemblage is cooled or heated, and the differential thermal expansion of layer 102 and layer 122 allows the separation of the assemblage into two parts to expose the island on wafer 102 and a recess in layer 122, as shown (step 140). Other approaches for separating such an assemblage, or composite, are disclosed in U.S. Patent Application Publication No. 2003/0068431, incorporated herein by reference in its entirety. Oxygen is admitted which oxidizes at least the surface of the island 112, forming an oxide layer 142, which is thicker than the metal layer so that the island is now higher and wider (expanded island). In step 150, the two pieces of the assemblage are brought into close proximity so that the expanded oxide layer 142 is in contact with the island-shaped recess in layer 122. However the island is now bigger than the recess, and this leads to the creation of a small gap 152 between layers 102 and 122. These layers form a pair of closely spaced matching electrodes separated by an insulating oxide spacer. Gap 152 could be made less than 10 nm.

Although the above specification contains many specificities, these should not be construed as limiting the scope of the invention but as merely providing illustrations of some of the presently preferred embodiments of this invention.

For example, piezo-electric, actuators could be used to position either or both electrodes during the manufacturing process.

Although no specific construction approaches have been described, the devices of the invention may be constructed as MicroElectroMechanicalSystems (MEMS) devices using micro-machining of an appropriate substrate. Integrated circuit techniques and very large scale integration techniques for forming electrode surfaces on an appropriate substrate may also be used to fabricate the devices. Other approaches useful in the construction of these devices include vapor deposition, fluid deposition, electrolytic deposition, printing, silkscreen printing, airbrushing, and solution plating.

Substrates that may be used in the construction of these devices are well known to the art and include silicon, silica, glass, metals, and quartz.

The invention claimed is:

1. A pair of electrodes comprising:

(a) a substantially flat first electrode;

(b) one or more islands of a material covering pre-determined regions of said first electrode, wherein regions of said first electrode not covered by said one or more islands provide an active first surface;

(b) a second electrode having one or more recesses in its surface at similar loci to said islands on said first electrode, wherein regions of said second electrode not having said one or more recesses provide an active second surface in which any imperfections on said first active surface are matched on said second active surface, said recesses being slightly smaller than said islands;

wherein said active surfaces are separated by a distance in the range of 1 to 100 nm when said recesses contact said islands.

2. The pair of electrodes of claim 1 in which said first electrode comprises titanium.

3. The pair of electrodes of claim 1 in which said first electrode is disposed on a substrate selected from the group consisting of: silicon, silica, glass, metals, and quartz.

4. The pair of electrodes of claim 1 which said material comprises an oxidizable metal having an oxidized surface.

5. The pair of electrodes of claim 4 in which said oxidizable metal is aluminum.

6. The pair of electrodes of claim 1 in which said second electrode material is silver.

7. The pair of electrodes of claim 1 additionally comprising a layer of conductive material on said second electrode.

8. The pair of electrodes of claim 7 in which said conductive material is copper.

* * * * *